(12) United States Patent
Yang et al.

(10) Patent No.: US 10,381,097 B2
(45) Date of Patent: Aug. 13, 2019

(54) READ MODE TUNING

(71) Applicant: Western Digital Technologies, Inc., San Jose, CA (US)

(72) Inventors: Nian Niles Yang, Mountain View, CA (US); Grishma Shah, Milpitas, CA (US); Philip David Reusswig, Mountain View, CA (US); Zhenlei Shen, Milpitas, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 15/799,815

(22) Filed: Oct. 31, 2017

(65) Prior Publication Data

US 2019/0130989 A1    May 2, 2019

(51) Int. Cl.
| | |
|---|---|
| *G11C 7/00* | (2006.01) |
| *G11C 29/00* | (2006.01) |
| *G11C 29/14* | (2006.01) |
| *G11C 29/56* | (2006.01) |
| *G11C 7/10* | (2006.01) |

(52) U.S. Cl.
CPC .......... *G11C 29/14* (2013.01); *G11C 7/1045* (2013.01); *G11C 29/56008* (2013.01); *G11C 2029/5606* (2013.01)

(58) Field of Classification Search
CPC .............. G11C 29/14; G11C 29/56008; G11C 2029/5606; G11C 7/1045
See application file for complete search history.

(56) References Cited

U.S. PATENT DOCUMENTS

| | | | |
|---|---|---|---|
| 9,672,940 B1* | 6/2017 | Reusswig | G11C 16/10 |
| 2009/0049364 A1* | 2/2009 | Jo | G06F 11/1072 |
| | | | 714/763 |
| 2014/0254264 A1* | 9/2014 | Dutta | G11C 16/3459 |
| | | | 365/185.03 |
| 2015/0078094 A1* | 3/2015 | Nagashima | G11C 16/26 |
| | | | 365/185.21 |
| 2018/0129431 A1* | 5/2018 | Yang | G06F 3/0619 |

* cited by examiner

*Primary Examiner* — Toan K Le
(74) *Attorney, Agent, or Firm* — Kunzler Bean & Adamson, PC

(57) ABSTRACT

Apparatuses, systems, methods, and computer program products are disclosed for performing read mode tuning. An apparatus includes an error rate storage circuit that determines error rate information. An apparatus includes a mode selection circuit that determines a read mode of a plurality of read modes for reading a set of memory cells based on error rate information. The plurality of read modes may include a fast read mode and a normal read mode. An apparatus includes a read circuit that performs a read on a set of memory cells based on a read mode.

20 Claims, 10 Drawing Sheets

READ MODE TUNING

TECHNICAL FIELD

The present disclosure, in various embodiments, relates to memory and more particularly relates to performing read mode tuning for reading memory cells.

BACKGROUND

Many electrical circuits and devices, such as memory devices or the like, have a number of memory cells. In certain configurations, memory cells may have a higher bit error rate in response to being read using a fast read mode as compared to the memory cells being read using a normal read mode.

SUMMARY

Apparatuses are presented for performing read mode tuning. In one embodiment, an apparatus includes a set of memory cells. An apparatus, in certain embodiments, includes an error rate storage circuit that determines error rate information for a set of memory cells. An apparatus, in some embodiments, includes a mode selection circuit that determines a read mode of a plurality of read modes for reading a set of memory cells based on error rate information. In such embodiments, the plurality of read modes may include a fast read mode and a normal read mode. An apparatus, in various embodiments, includes a read circuit that performs a read on a set of memory cells based on a read mode.

Systems are presented for performing read mode tuning. A system, in one embodiment, includes a memory block. In various embodiments, a system includes a controller for a memory block. In a further embodiment, a controller is configured to determine a fast read error rate corresponding to performing a fast read on a memory block using a set of predetermined read parameters; and perform a fast read in response to the fast read error rate satisfying a fast read error rate threshold. In such an embodiment, the fast read performs a read at a faster speed than a normal read.

An apparatus for performing read mode tuning, in one embodiment, includes means for generating a fast read mode indicator based on a number of errors resulting from a fast read test on a plurality of memory cells. In some embodiments, an apparatus includes means for storing a fast read mode indicator. In various embodiments, an apparatus includes means for generating a normal read mode indicator based on a number of errors resulting from a normal read test on a plurality of memory cells. In certain embodiments, an apparatus includes means for storing a normal read mode indicator. In one embodiment, an apparatus includes means for performing a read operation for a plurality of memory cells based on one or more of a stored fast read mode indicator and a normal read mode indicator.

BRIEF DESCRIPTION OF THE DRAWINGS

A more particular description is included below with reference to specific embodiments illustrated in the appended drawings. Understanding that these drawings depict only certain embodiments of the disclosure and are not therefore to be considered to be limiting of its scope, the disclosure is described and explained with additional specificity and detail through the use of the accompanying drawings, in which.

DETAILED DESCRIPTION

Figure 1A:
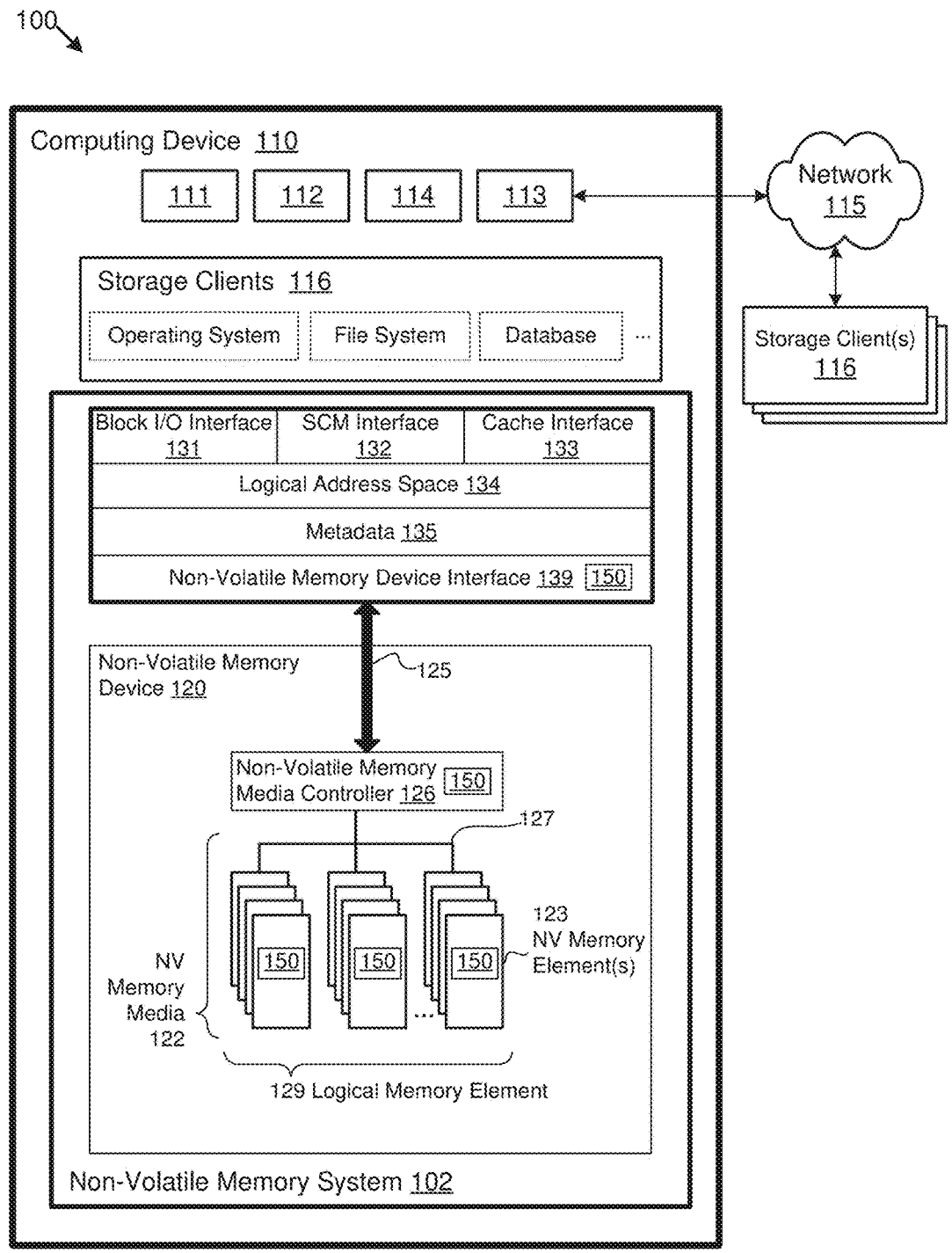
FIG. 1A is a schematic block diagram illustrating one embodiment of a system for performing read mode tuning.

Aspects of the present disclosure may be embodied as an apparatus, system, method, or computer program product. Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "circuit," "module," "apparatus," or "system." Furthermore, aspects of the present disclosure may take the form of a computer program product embodied in one or more non-transitory computer readable storage media storing computer readable and/or executable program code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like.

Modules may also be implemented at least partially in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may include a single instruction, or many instructions, and may even be distributed over several different code segments, among different programs, across several memory devices, or the like. Where a module or portions of a module are implemented in software, the software portions may be stored on one or more computer readable and/or executable storage media. Any combination of one or more computer readable storage media may be utilized. A computer readable storage medium may include, for example, but not limited to, an electronic, magnetic, optical, electromagnetic, infrared, or semiconductor system, apparatus, or device, or any suitable combination of the foregoing, but would not include propagating signals. In the context of this document, a computer readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object oriented programming language such as Python, Java, Smalltalk, C++, C#, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may alternatively be embodied by or implemented as a component.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

FIG. 1A is a block diagram of one embodiment of a system 100 comprising a read mode tuning component 150 for a non-volatile memory device 120. The read mode tuning component 150 may be part of and/or in communication with a non-volatile memory media controller 126, a non-volatile memory element 123, a device driver, or the like. The read mode tuning component 150 may operate on a non-volatile memory system 102 of a computing device 110, which may comprise a processor 111, volatile memory 112, and a communication interface 113. The processor 111 may comprise one or more central processing units, one or more general-purpose processors, one or more application-specific processors, one or more virtual processors (e.g., the computing device 110 may be a virtual machine operating within a host), one or more processor cores, or the like. The communication interface 113 may comprise one or more network interfaces configured to communicatively couple the computing device 110 and/or non-volatile memory controller 126 to a communication network 115, such as an Internet Protocol (IP) network, a Storage Area Network (SAN), wireless network, wired network, or the like.

The non-volatile memory device 120, in various embodiments, may be disposed in one or more different locations relative to the computing device 110. In one embodiment, the non-volatile memory device 120 comprises one or more non-volatile memory elements 123, such as semiconductor chips or packages or other integrated circuit devices disposed on one or more printed circuit boards, storage housings, and/or other mechanical and/or electrical support structures. For example, the non-volatile memory device 120 may comprise one or more direct inline memory module (DIMM) cards, one or more expansion cards and/or daughter cards, a solid-state-drive (SSD) or other hard drive device, and/or may have another memory and/or storage form factor. The non-volatile memory device 120 may be integrated with and/or mounted on a motherboard of the computing device 110, installed in a port and/or slot of the computing device 110, installed on a different computing device 110 and/or a dedicated storage appliance on the network 115, in communication with the computing device 110 over an external bus (e.g., an external hard drive), or the like.

The non-volatile memory device 120, in one embodiment, may be disposed on a memory bus of a processor 111 (e.g., on the same memory bus as the volatile memory 112, on a different memory bus from the volatile memory 112, in place of the volatile memory 112, or the like). In a further embodiment, the non-volatile memory device 120 may be disposed on a peripheral bus of the computing device 110, such as a peripheral component interconnect express (PCI Express or PCIe) bus, a serial Advanced Technology Attachment (SATA) bus, a parallel Advanced Technology Attachment (PATA) bus, a small computer system interface (SCSI) bus, a FireWire bus, a Fibre Channel connection, a Universal Serial Bus (USB), a PCIe Advanced Switching (PCIe-AS) bus, or the like. In another embodiment, the non-volatile memory device 120 may be disposed on a data network 115, such as an Ethernet network, an Infiniband network, SCSI RDMA over a network 115, a storage area network (SAN), a local area network (LAN), a wide area network (WAN) such as the Internet, another wired and/or wireless network 115, or the like.

The computing device 110 may further comprise a non-transitory, computer readable storage medium 114. The computer readable storage medium 114 may comprise executable instructions configured to cause the computing device 110 (e.g., processor 111) to perform steps of one or more of the methods disclosed herein. Alternatively, or in addition, the read mode tuning component 150 may be embodied as one or more computer readable instructions stored on the non-transitory storage medium 114.

The non-volatile memory system 102, in the depicted embodiment, includes a read mode tuning component 150. The read mode tuning component 150, in one embodiment, is configured to determine error rate information for a set of memory cells of the non-volatile memory device 120 (e.g., a memory block) described below. The read mode tuning component 150, in certain embodiments, may determines a read mode of a plurality of read modes for reading the set of memory cells based on the error rate information. In such embodiments, the plurality of read modes may include a fast read mode and a normal read mode. The read mode tuning component 150, in some embodiments, may perform a read on the set of memory cells based on the read mode. As used herein, a memory block may refer to any group or set of non-volatile memory elements 123, memory cells, and/or storage elements.

In one embodiment, the read mode tuning component 150 may comprise logic hardware of one or more non-volatile memory devices 120, such as a non-volatile memory media controller 126, a non-volatile memory element 123, a device controller, a field-programmable gate array (FPGA) or other programmable logic, firmware for an FPGA or other programmable logic, microcode for execution on a microcontroller, an application-specific integrated circuit (ASIC), or the like. In another embodiment, the read mode tuning component 150 may comprise executable software code, such as a device driver or the like, stored on the computer readable storage medium 114 for execution on the processor 111. In a further embodiment, the read mode tuning component 150 may include a combination of both executable software code and logic hardware. FIG. 1A illustrates the read mode tuning component 150 in multiple components to illustrate that the read mode tuning component 150 may be entirely in one or more components of FIG. 1A and/or partially within one or more components of FIG. 1A. For example, the entire read mode tuning component 150 may be part of the non-volatile memory elements 123, the non-volatile memory medial controller 126, and/or the non-volatile memory device interface 139. As another example, portions of the read mode tuning component 150 may be part of the non-volatile memory elements 123, the non-volatile memory medial controller 126, and/or the non-volatile memory device interface 139. It should be noted that the read mode tuning component 150 may be in only one of the illustrated components and/or the read mode tuning component 150 may be in components of FIG. 1A that do not illustrate the read mode tuning component 150 therein.

In one embodiment, the read mode tuning component 150 is configured to receive storage requests from a device driver or other executable application via a bus 125 or the like. The read mode tuning component 150 may be further configured to transfer data to/from a device driver and/or storage clients 116 via the bus 125. Accordingly, the read mode tuning component 150, in some embodiments, may comprise and/or be in communication with one or more direct memory access (DMA) modules, remote DMA modules, bus controllers, bridges, buffers, and so on to facilitate the transfer of storage requests and associated data. In another embodiment, the read mode tuning component 150 may receive storage requests as an API call from a storage client 116, as an IO-CTL command, or the like.

According to various embodiments, a non-volatile memory controller 126 in communication with one or more read mode tuning components 150 may manage one or more non-volatile memory devices 120 and/or non-volatile memory elements 123. The non-volatile memory device(s) 120 may comprise recording, memory, and/or storage devices, such as solid-state storage device(s) and/or semiconductor storage device(s) that are arranged and/or partitioned into a plurality of addressable media storage locations. As used herein, a media storage location refers to any physical unit of memory (e.g., any quantity of physical storage media on a non-volatile memory device 120). Memory units may include, but are not limited to: pages, memory divisions, blocks, sectors, collections or sets of physical storage locations (e.g., logical pages, logical blocks), or the like.

A device driver and/or the non-volatile memory media controller 126, in certain embodiments, may present a logical address space 134 to the storage clients 116. As used herein, a logical address space 134 refers to a logical representation of memory resources. The logical address space 134 may comprise a plurality (e.g., range) of logical addresses. As used herein, a logical address refers to any identifier for referencing a memory resource (e.g., data), including, but not limited to: a logical block address (LBA), cylinder/head/sector (CHS) address, a file name, an object identifier, an inode, a Universally Unique Identifier (UUID), a Globally Unique Identifier (GUID), a hash code, a signature, an index entry, a range, an extent, or the like.

In some embodiments, the non-volatile memory media controller 126 (or another controller) may be configured to: determine a fast read error rate corresponding to performing a fast read on the memory block using a set of predetermined read parameters; perform a fast read in response to the fast read error rate satisfying a fast read error rate threshold, wherein the fast read performs a read at a faster speed than a normal read; determine a normal read error rate corresponding to performing a normal read on the memory block using the set of predetermined read parameters; perform a normal read in response to the fast read error rate failing to satisfy the fast read error rate threshold and the normal read error rate satisfying a normal read error rate threshold; determine the normal read error rate by performing a normal read on the memory block; store data indicating the normal read error rate; store an indication that indicates whether to perform a normal read on the memory block based on the set of predetermined read parameters; determine the fast read error rate by performing a fast read on the memory block; store data indicating the fast read error rate; store an indication that indicates whether to perform a fast read on the memory block based on the set of predetermined read parameters; and/or store data indicating the set of predetermined read parameters.

A device driver for the non-volatile memory device 120 may maintain metadata 135, such as a logical to physical address mapping structure, to map logical addresses of the logical address space 134 to media storage locations on the non-volatile memory device(s) 120. A device driver may be configured to provide storage services to one or more storage clients 116. The storage clients 116 may include local storage clients 116 operating on the computing device 110 and/or remote, storage clients 116 accessible via the network 115 and/or network interface 113. The storage clients 116 may include, but are not limited to: operating systems, file systems, database applications, server applications, kernel-level processes, user-level processes, applications, and the like.

A device driver may be communicatively coupled to one or more non-volatile memory devices 120. The one or more non-volatile memory devices 120 may include different types of non-volatile memory devices including, but not limited to: solid-state storage devices, semiconductor storage devices, SAN storage resources, or the like. The one or more non-volatile memory devices 120 may comprise one or more respective non-volatile memory media controllers 126 and non-volatile memory media 122. A device driver may provide access to the one or more non-volatile memory devices 120 via a traditional block I/O interface 131. Additionally, a device driver may provide access to enhanced functionality through the SCM interface 132. The metadata 135 may be used to manage and/or track data operations performed through any of the Block I/O interface 131, SCM interface 132, cache interface 133, or other, related interfaces.

The cache interface 133 may expose cache-specific features accessible via a device driver for the non-volatile memory device 120. Also, in some embodiments, the SCM interface 132 presented to the storage clients 116 provides access to data transformations implemented by the one or more non-volatile memory devices 120 and/or the one or more non-volatile memory media controllers 126.

A device driver may present a logical address space 134 to the storage clients 116 through one or more interfaces. As discussed above, the logical address space 134 may comprise a plurality of logical addresses, each corresponding to respective media locations of the one or more non-volatile memory devices 120. A device driver may maintain metadata 135 comprising any-to-any mappings between logical addresses and media locations, or the like.

A device driver may further comprise and/or be in communication with a non-volatile memory device interface 139 configured to transfer data, commands, and/or queries to the one or more non-volatile memory devices 120 over a bus 125, which may include, but is not limited to: a memory bus of a processor 111, a peripheral component interconnect express (PCI Express or PCIe) bus, a serial Advanced Technology Attachment (ATA) bus, a parallel ATA bus, a small computer system interface (SCSI), FireWire, Fibre Channel, a Universal Serial Bus (USB), a PCIe Advanced Switching (PCIe-AS) bus, a network 115, Infiniband, SCSI RDMA, or the like. The non-volatile memory device interface 139 may communicate with the one or more non-volatile memory devices 120 using input-output control (IO-CTL) command(s), IO-CTL command extension(s), remote direct memory access, or the like.

The communication interface 113 may comprise one or more network interfaces configured to communicatively couple the computing device 110 and/or the non-volatile memory controller 126 to a network 115 and/or to one or more remote, network-accessible storage clients 116. The storage clients 116 may include local storage clients 116 operating on the computing device 110 and/or remote, storage clients 116 accessible via the network 115 and/or the network interface 113. The non-volatile memory controller 126 is part of and/or in communication with one or more non-volatile memory devices 120. Although FIG. 1A depicts a single non-volatile memory device 120, the disclosure is not limited in this regard and could be adapted to incorporate any number of non-volatile memory devices 120.

The non-volatile memory device 120 may comprise one or more elements 123 of non-volatile memory media 122, which may include but is not limited to: ReRAM, Memristor memory, programmable metallization cell memory, phase-change memory (PCM, PCME, PRAM, PCRAM, ovonic unified memory, chalcogenide RAM, or C-RAM), NAND flash memory (e.g., 2D NAND flash memory, 3D NAND flash memory), NOR flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS), programmable metallization cell (PMC), conductive-bridging RAM (CBRAM), magneto-resistive RAM (MRAM), magnetic storage media (e.g., hard disk, tape), optical storage media, or the like. The one or more elements 123 of non-volatile memory media 122, in certain embodiments, comprise storage class memory (SCM).

While legacy technologies such as NAND flash may be block and/or page addressable, storage class memory, in one embodiment, is byte addressable. In further embodiments, storage class memory may be faster and/or have a longer life (e.g., endurance) than NAND flash; may have a lower cost, use less power, and/or have a higher storage density than DRAM; or offer one or more other benefits or improvements when compared to other technologies. For example, storage class memory may comprise one or more non-volatile memory elements 123 of ReRAM, Memristor memory, programmable metallization cell memory, phase-change memory, nano RAM, nanocrystal wire-based memory, silicon-oxide based sub-10 nanometer process memory, graphene memory, SONOS memory, PMC memory, CBRAM, MRAM, and/or variations thereof.

While the non-volatile memory media 122 is referred to herein as "memory media," in various embodiments, the non-volatile memory media 122 may more generally comprise one or more non-volatile recording media capable of recording data, which may be referred to as a non-volatile memory medium, a non-volatile storage medium, or the like. Further, the non-volatile memory device 120, in various embodiments, may comprise a non-volatile recording device, a non-volatile memory device, a non-volatile storage device, or the like.

The non-volatile memory media 122 may comprise one or more non-volatile memory elements 123, which may include, but are not limited to: chips, packages, planes, die, or the like. A non-volatile memory media controller 126 may be configured to manage data operations on the non-volatile memory media 122, and may comprise one or more processors, programmable processors (e.g., FPGAs), ASICs, micro-controllers, or the like. In some embodiments, the non-volatile memory media controller 126 is configured to store data on and/or read data from the non-volatile memory media 122, to transfer data to/from the non-volatile memory device 120, and so on.

The non-volatile memory media controller 126 may be communicatively coupled to the non-volatile memory media 122 by way of a bus 127. The bus 127 may comprise an I/O bus for communicating data to/from the non-volatile memory elements 123. The bus 127 may further comprise a control bus for communicating addressing and other command and control information to the non-volatile memory elements 123. In some embodiments, the bus 127 may communicatively couple the non-volatile memory elements 123 to the non-volatile memory media controller 126 in parallel. This parallel access may allow the non-volatile memory elements 123 to be managed as a group, forming a logical memory element 129. The logical memory element may be partitioned into respective logical memory units (e.g., logical pages) and/or logical memory divisions (e.g., logical blocks). The logical memory units may be formed by logically combining physical memory units of each of the non-volatile memory elements.

The non-volatile memory controller 126 may organize a block of word lines within a non-volatile memory element 123, in certain embodiments, using addresses of the word lines, such that the word lines are logically organized into a monotonically increasing sequence (e.g., decoding and/or translating addresses for word lines into a monotonically increasing sequence, or the like). In a further embodiment, word lines of a block within a non-volatile memory element 123 may be physically arranged in a monotonically increasing sequence of word line addresses, with consecutively addressed word lines also being physically adjacent (e.g., WL0, WL1, WL2, WLN).

The non-volatile memory controller 126 may comprise and/or be in communication with a device driver executing on the computing device 110. A device driver may provide storage services to the storage clients 116 via one or more interfaces 131, 132, and/or 133. In some embodiments, a device driver provides a block-device I/O interface 131 through which storage clients 116 perform block-level I/O operations. Alternatively, or in addition, a device driver may provide a storage class memory (SCM) interface 132, which may provide other storage services to the storage clients 116. In some embodiments, the SCM interface 132 may comprise extensions to the block device interface 131 (e.g., storage clients 116 may access the SCM interface 132 through extensions or additions to the block device interface 131). Alternatively, or in addition, the SCM interface 132 may be provided as a separate API, service, and/or library. A device driver may be further configured to provide a cache interface 133 for caching data using the non-volatile memory system 102.

A device driver may further comprise a non-volatile memory device interface 139 that is configured to transfer data, commands, and/or queries to the non-volatile memory media controller 126 over a bus 125, as described above.

Figure 1B:
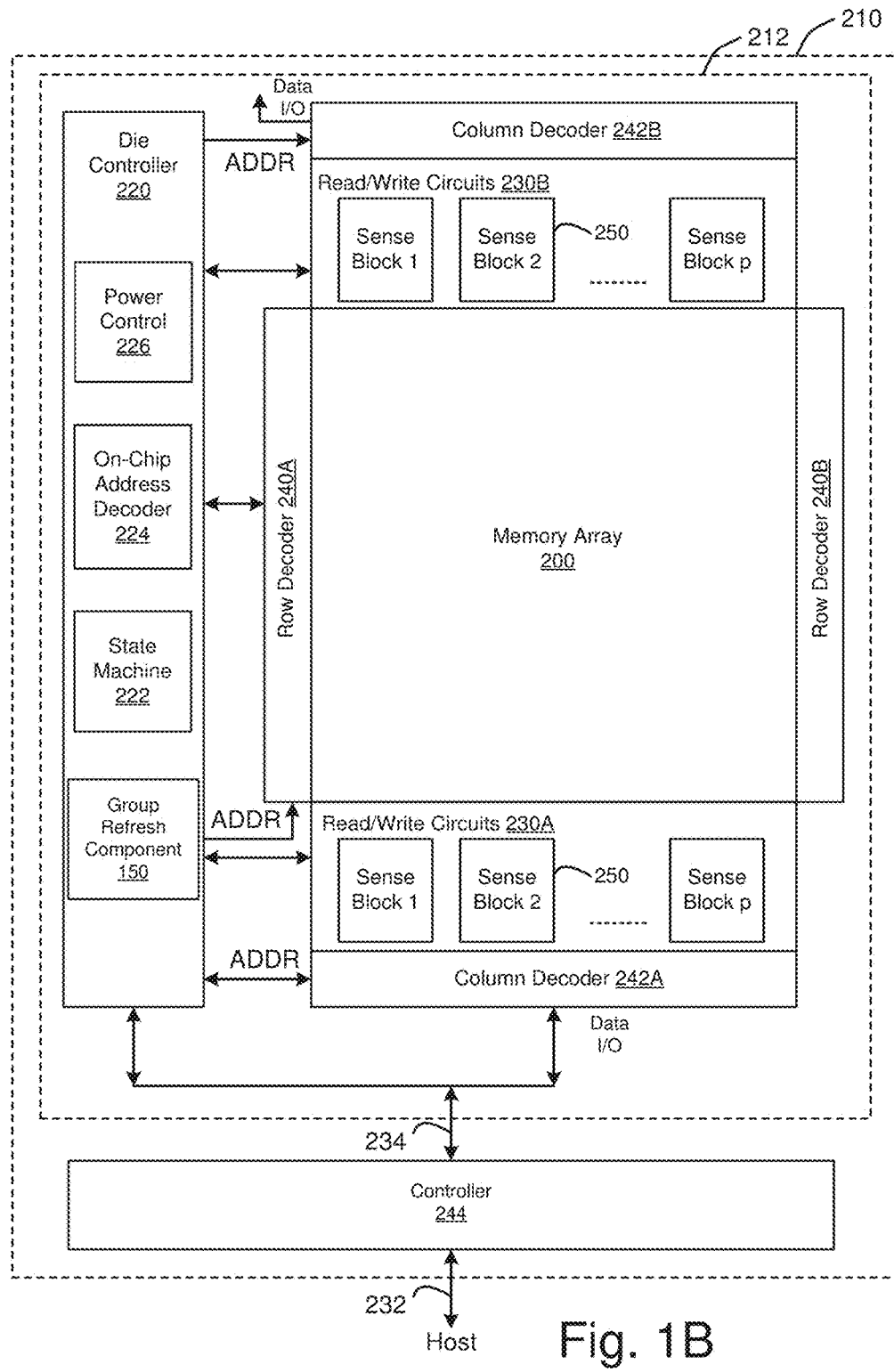
FIG. 1B is a schematic block diagram illustrating another embodiment of a system for performing read mode tuning.

FIG. 1B illustrates an embodiment of a non-volatile storage device 210 that may include one or more memory die or chips 212. Memory die 212, in some embodiments, includes an array (two-dimensional or three dimensional) of memory cells 200, die controller 220, and read/write circuits 230A/230B. In one embodiment, access to the memory array 200 by the various peripheral circuits is implemented in a symmetric fashion, on opposite sides of the array, so that the densities of access lines and circuitry on each side are reduced by half. The read/write circuits 230A/230B, in a further embodiment, include multiple sense blocks 250 which allow a page of memory cells to be read or programmed in parallel.

The memory array 200, in various embodiments, is addressable by word lines via row decoders 240A/240B and by bit lines via column decoders 242A/242B. In some embodiments, a controller 244 is included in the same memory device 210 (e.g., a removable storage card or package) as the one or more memory die 212. Commands and data are transferred between the host and controller 244 via lines 232 and between the controller and the one or more memory die 212 via lines 234. One implementation can include multiple chips 212.

Die controller 220, in one embodiment, cooperates with the read/write circuits 230A/230B to perform memory operations on the memory array 200. The die controller 220, in certain embodiments, includes a read mode tuning component 150, a state machine 222, and an on-chip address decoder 224. In one embodiment, the state machine 222 comprises at least a portion of the read mode tuning component 150. In a further embodiment, the controller 244 comprises at least a portion of the read mode tuning component 150.

The read mode tuning component 150, in one embodiment, is configured to determine a fast read error rate corresponding to performing a fast read on a memory block using a set of predetermined read parameters, and perform a fast read in response to the fast read error rate satisfying a fast read error rate threshold. In such an embodiment, the fast read performs a read at a faster speed than a normal read.

The state machine 222, in one embodiment, provides chip-level control of memory operations. The on-chip address decoder 224 provides an address interface to convert between the address that is used by the host or a memory controller to the hardware address used by the decoders 240A, 240B, 242A, 242B. In certain embodiments, the state machine 222 includes an embodiment of the read mode tuning component 150. The read mode tuning component 150, in certain embodiments, is embodied as software in a device driver, hardware in a device controller 244, and/or hardware in a die controller 220 and/or state machine 222.

In one embodiment, one or any combination of die controller 220, read mode tuning component 150, decoder circuit 224, state machine circuit 222, decoder circuit 242A, decoder circuit 242B, decoder circuit 240A, decoder circuit 240B, read/write circuits 230A, read/write circuits 230B, and/or controller 244 can be referred to as one or more managing circuits.

Figure 2:
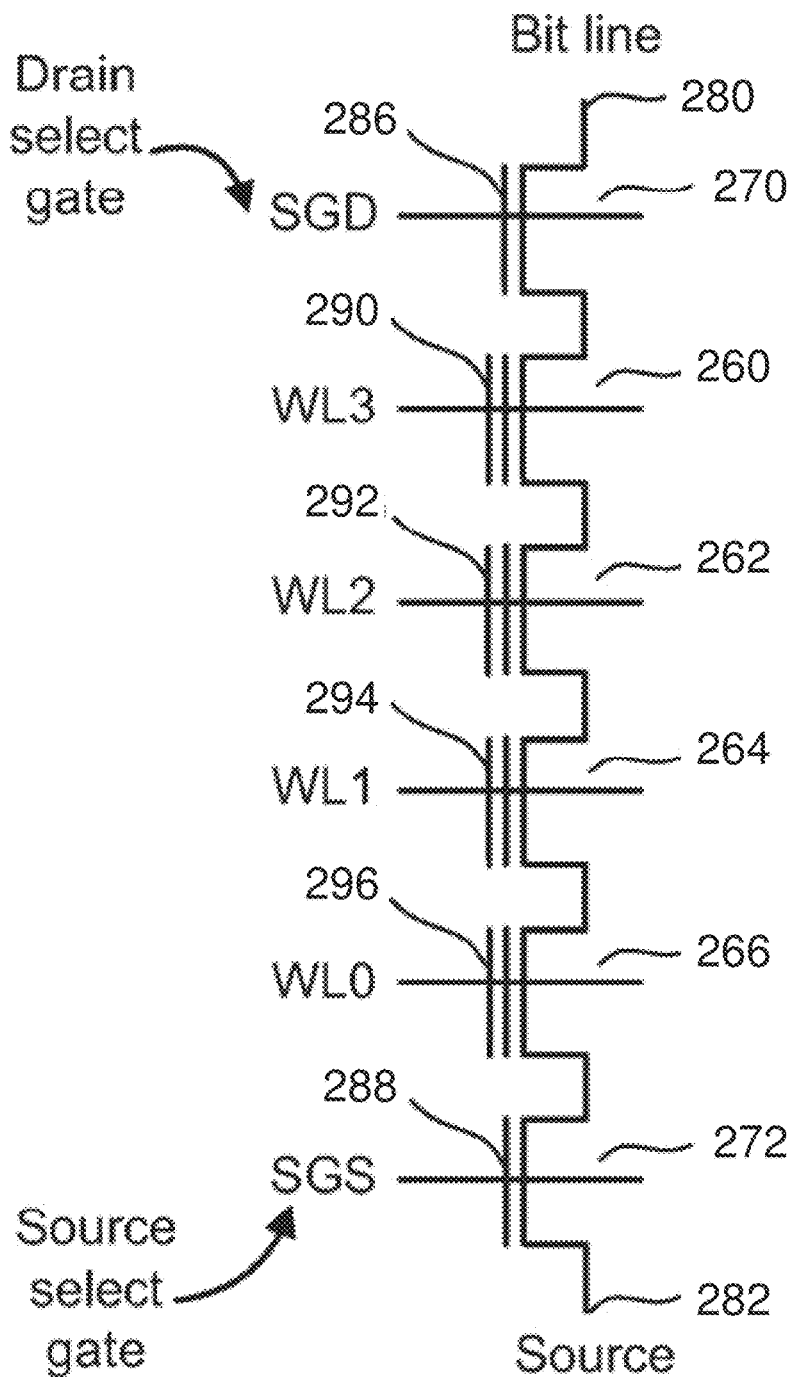
FIG. 2 is a schematic block diagram illustrating one embodiment of a string of storage cells.

FIG. 2 depicts one embodiment of a NAND string comprising a plurality of storage elements. The NAND string depicted in FIG. 2, in some embodiments, includes four transistors 260, 262, 264, 266 connected in series and located between a first select transistor 270 and a second select transistor 272. In some embodiments, a transistor 260, 262, 264, 266 includes a control gate and a floating gate. A control gate 290, 292, 294, 296, in one embodiment, is connected to, or comprises a portion of, a word line. In a further embodiment, a transistor 260, 262, 264, 266 is a storage element, storage cell, or the like, also referred to as a memory cell. In some embodiments, a storage element may include multiple transistors 260, 262, 264, 266.

The first select transistor 270, in some embodiments, gates/connects the NAND string connection to a bit line 280 via a drain select gate SGD. The second select transistor 272, in certain embodiments, gates/connects the NAND string connection to a source line 282 via a source select gate SGS. The first select transistor 270, in a further embodiment, is controlled by applying a voltage to a corresponding select gate 286. The second select transistor 272, in some embodiments, is controlled by applying a voltage to corresponding select gate 288.

As shown in FIG. 2, the source line 282, in one embodiment, is connected to the sources of each transistor/storage cell 260, 262, 264, 266 in the NAND string. The NAND string, in some embodiments, may include some storage elements 260, 262, 264, 266 that have been programmed and some storage elements 260, 262, 264, 266 that have not been programmed. As described in more detail below, the read mode tuning component 150 determines the best type of read to perform on memory cells given various configuration parameters.

Figure 3:
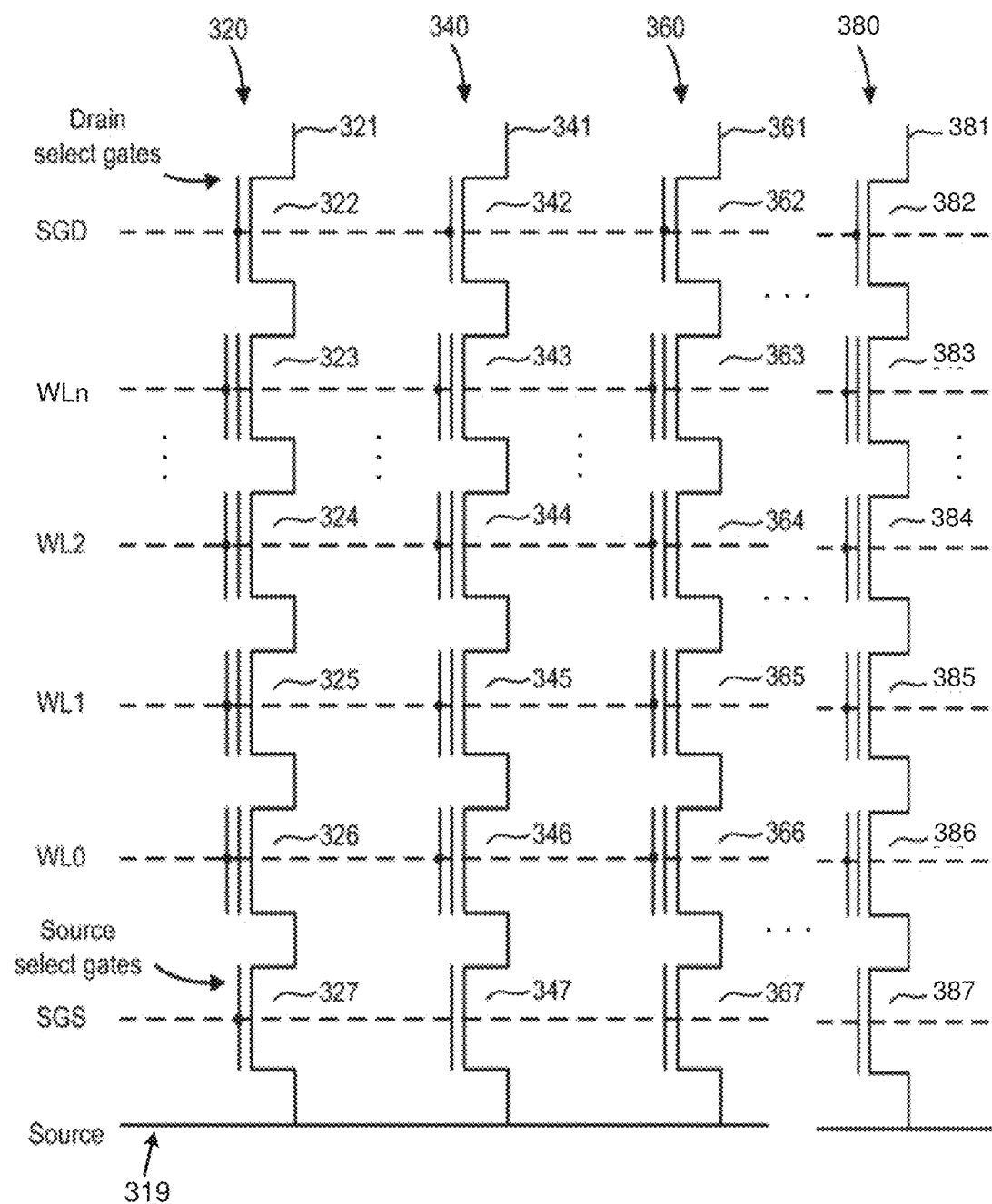
FIG. 3 is a schematic block diagram illustrating one embodiment of an array of storage cells.

FIG. 3 is a circuit diagram depicting a plurality of NAND strings 320, 340, 360, 380. An architecture for a flash memory system using a NAND structure may include several NAND strings 320, 340, 360, 380. For example, FIG. 3 illustrates NAND strings 320, 340, 360, 380 in a memory array 200 that includes multiple NAND strings 320, 340, 360, 380. In the depicted embodiment, each NAND string 320, 340, 360, 380 includes drain select transistors 322, 342, 362, 382, source select transistors 327, 347, 367, 387, and storage elements 323-326, 343-346, 363-366, 383-386. While four storage elements 323-326, 343-346, 363-366, 383-386 per NAND string 320, 340, 360, 380 are illustrated for simplicity, some NAND strings 320, 340, 360, 380 can include any number of storage elements, e.g., thirty-two, sixty-four, or the like storage elements.

NAND strings 320, 340, 360, 380, in one embodiment, are connected to a source line 319 by source select transistors 327, 347, 367, 387. A selection line SGS may be used to control the source side select transistors. The various NAND strings 320, 340, 360, 380, in one embodiment, are connected to bit lines 321, 341, 361, 381 by drain select transistors 322, 342, 362, 382. The drain select transistors 322, 342, 362, 382 may be controlled by a drain select line SGD. In some embodiments, the select lines do not necessarily need to be in common among the NAND strings 320, 340, 360, 380; that is, different select lines can be provided for different NAND strings 320, 340, 360, 380.

As described above, each word line WL0-WLn comprises one or more storage elements 323-383, 324-384, 325-385, 326-386. In the depicted embodiment, each bit line 321, 341, 361, 381 and the respective NAND string 320, 340, 360, 380 comprise the columns of the memory array 200, storage block, erase block, or the like. The word lines WL0-WLn, in some embodiments, comprise the rows of the memory array 200, storage block, erase block, or the like. Each word line WL0-WLn, in some embodiments, connects the control gates of each storage element 323-383, 324-384, 325-385, 326-386 in a row. Alternatively, the control gates may be provided by the word lines WL0-WLn themselves. In some embodiments, a word line WL0-WLn may include tens, hundreds, thousands, millions, or the like of storage elements 323-383, 324-384, 325-385, 326-386.

In one embodiment, each storage element 323-326, 343-346, 363-366, 383-386 is configured to store data. For example, when storing one bit of digital data, the range of possible threshold voltages ("VTH") of each storage element 323-326, 343-346, 363-366, 383-386 may be divided into two ranges which are assigned logical data "1" and "0." In one example of a NAND type flash memory, the VTH may be negative after the storage elements 323-326, 343-346, 363-366, 383-386 are erased, and defined as logic "1." In one embodiment, the VTH after a program operation is positive and defined as logic "0."

When the VTH is negative and a read is attempted, in some embodiments, storage elements 323-326, 343-346, 363-366, 383-386 will turn on to indicate logic "1" is being stored. When the VTH is positive and a read operation is attempted, in a further embodiment, a storage element will not turn on, which indicates that logic "0" is stored. Each storage element 323-383, 324-384, 325-385, 326-386 may also store multiple levels of information, for example, multiple bits of digital data. In such an embodiment, the range of VTH value is divided into the number of levels of data. For example, if four levels of information can be stored in each storage element 323-326, 343-346, 363-366, 383-386, there will be four VTH ranges assigned to the data values "11", "10", "01", and "00."

In one example of a NAND type memory, the VTH after an erase operation may be negative and defined as "11." Positive VTH values may be used for the states of "10", "01", and "00." In one embodiment, the specific relationship between the data programmed into the storage elements 323-326, 343-346, 363-366, 383-386 and the threshold voltage ranges of the storage elements 323-326, 343-346, 363-366, 383-386 depends upon the data encoding scheme adopted for the storage elements 323-326, 343-346, 363-366, 383-386.

In some embodiments, portions of the storage elements 323-326, 343-346, 363-366, 383-386 may be defective. In such an embodiment, the read mode tuning component 150 may manage which portions of the storage elements 323-326, 343-346, 363-366, 383-386 have corresponding read mode data stored.

Figure 4:
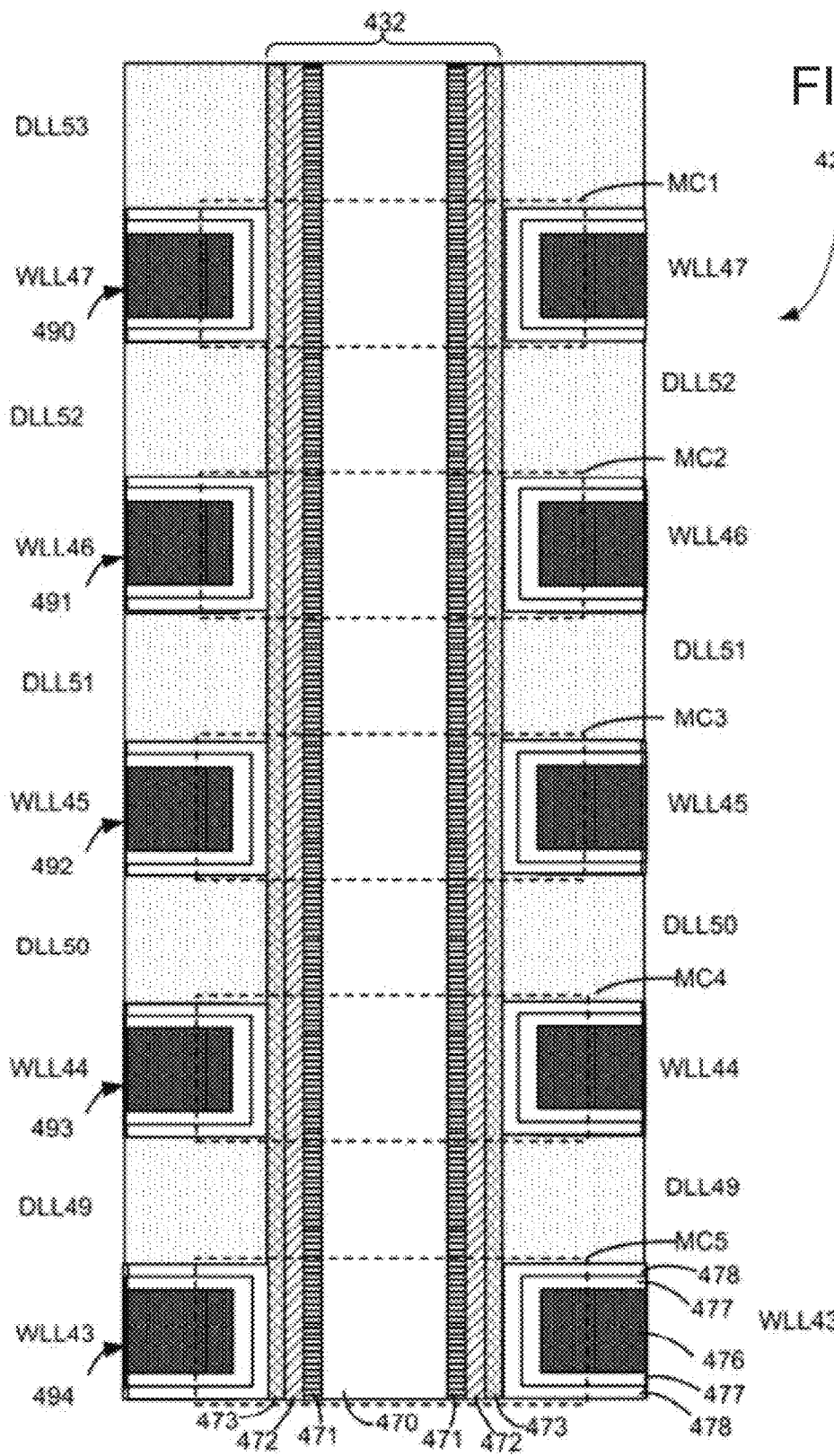
FIG. 4 illustrates one embodiment of a 3D, vertical NAND flash memory structure.

FIG. 4 illustrates one embodiment of a cross-sectional view of a 3D, vertical NAND flash memory structure 429 or string 429. In one embodiment, the vertical column 432 is round and includes four layers; however, in other embodiments more or less than four layers can be included and other shapes can be used (e.g., a "U" shape instead of an "I" shape or the like). In one embodiment, a vertical column 432 includes an inner core layer 470 that is made of a dielectric, such as SiO2. Other materials can also be used. Surrounding inner core 470 is polysilicon channel 471. Materials other than polysilicon can also be used. Note that it is the channel 471 that connects to the bit line. Surrounding channel 471 is a tunneling dielectric 472. In one embodiment, tunneling dielectric 472 has an ONO structure. Surrounding tunneling dielectric 472 is a shared charge trapping layer 473, such as (for example) Silicon Nitride. Other materials and structures can also be used. The technology described herein is not limited to any particular material or structure.

FIG. 4 depicts dielectric layers DLL49, DLL50, DLL51, DLL52 and DLL53, as well as word line layers WLL43, WLL44, WLL45, WLL46, and WLL47. Each of the word line layers includes a word line region 476 surrounded by an aluminum oxide layer 477, which is surrounded by a blocking oxide (SiO2) layer 478. The physical interaction of the word line layers with the vertical column forms the memory cells. Thus, a memory cell, in one embodiment, comprises channel 471, tunneling dielectric 472, charge trapping layer 473 (e.g., shared with other memory cells), blocking oxide layer 478, aluminum oxide layer 477 and word line region 476. In some embodiments, the blocking oxide layer 478 and aluminum oxide layer 477, may be replaced by a single layer of material with insulating properties or by more than 2 layers of different material with insulating properties.

Furthermore, the materials used are not limited to silicon dioxide (SiO2) or aluminum oxide. For example, word line layer WLL47 and a portion of vertical column 432 comprise a memory cell MC1. Word line layer WLL46 and a portion of vertical column 432 comprise a memory cell MC2. Word line layer WLL45 and a portion of vertical column 432 comprise a memory cell MC3. Word line layer WLL44 and a portion of vertical column 432 comprise a memory cell MC4. Word line layer WLL43 and a portion of vertical column 432 comprise a memory cell MC5. In other architectures, a memory cell may have a different structure; however, the memory cell would still be the storage unit.

When a memory cell is programmed, electrons are stored in a portion of the charge trapping layer 473 which is associated with the memory cell. These electrons are drawn into the charge trapping layer 473 from the channel 471, through the tunneling dielectric 472, in response to an appropriate voltage on word line region 476. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

Storage cells in the same location or position in different memory structures 429 (e.g., different NAND strings 429) on different bit lines, in certain embodiments, may be on the same word line. Each word line may store one page of data, such as when 1-bit of data is stored per cell (SLC); two pages of data, such as when 2-bits of data are stored per cell (MLC); three pages of data, such as when 3-bits of data are stored per cell (TLC); four pages of data, such as when 4-bits of data are stored per cell (QLC); or another number of pages of data.

In the depicted embodiment, a vertical, 3D NAND flash memory structure 429 comprises an "I" shaped memory structure 429. In other embodiments, a vertical, 3D NAND flash memory structure 429 may comprise a "U" shaped structure, or may have another vertical and/or stacked architecture. In certain embodiments, four sets of strings 429 (e.g., four sets of 48 word lines, or another predefined number of word lines) may form an erase block, while in other embodiments, fewer or more than four sets of strings 429 may form an erase block. As may be appreciated, any suitable number of storage cells may be part of a single string 429. In one embodiment, a single string 429 includes 48 storage cells.

Figure 5:
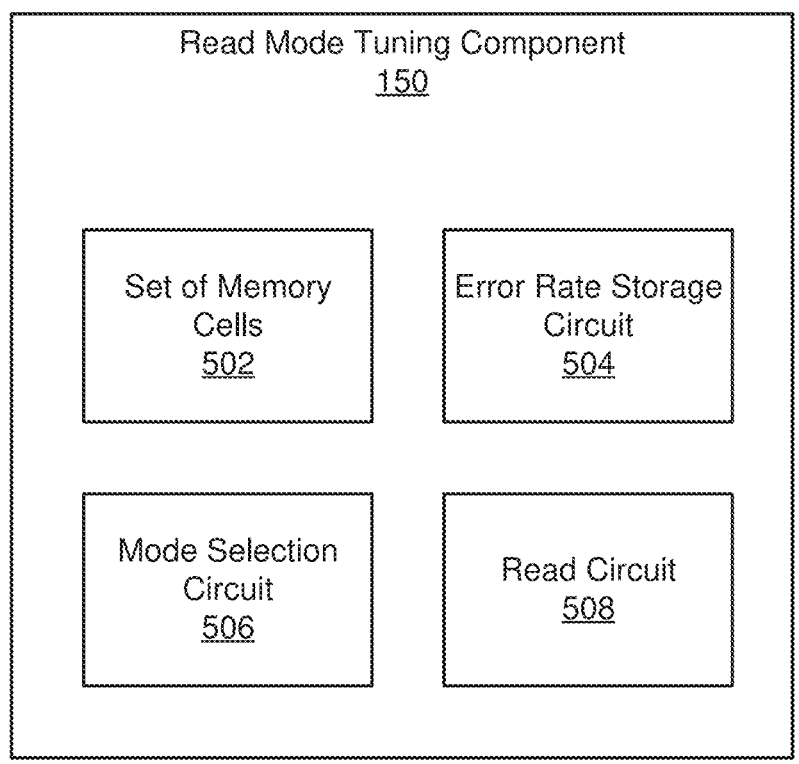
FIG. 5 is a schematic block diagram illustrating one embodiment of a read mode tuning component.

FIG. 5 depicts one embodiment of a read mode tuning component 150. The read mode tuning component 150 may be substantially similar to the read mode tuning component 150 described above with regard to FIGS. 1A, 1B, 2, and/or 3. In general, as described above, the read mode tuning component 150 determines error rate information for a set of memory cells, determines a read mode of a plurality of read modes for reading the set of memory cells based on the error rate information, and performs a read on the set of memory cells based on the read mode. The plurality of read modes may include a fast read mode and a normal read mode. Accordingly, the read mode tuning component 150 may facilitate performing read mode tuning. In the depicted embodiment, the read mode tuning component 150 includes a set of memory cells 502, an error rate storage circuit 504, a mode selection circuit 506, and a read circuit 508.

In one embodiment, the set of memory cells 502 (e.g., a memory block) may be may be any suitable groups of memory cells (e.g., storage locations). In certain embodiments, the set of memory cells 502 may any suitable number of memory cells. In various embodiments, the set of memory cells 502 may operate using the same read configuration. Moreover, the set of memory cells 502 may collectively have a corresponding bit error rate for a normal read, a corresponding bit error rate for a fast read, a corresponding normal read flag, a corresponding fast read flag, and/or a low-density parity-check (LDPC) action for a particular read configuration (e.g., read parameters).

In certain embodiments, the error rate storage circuit 504 may determine error rate information for the set of memory cells. In various embodiments, the error rate information for the set of memory cells may include: a bit error rate for a normal read (e.g., normal mode read error rate), a bit error rate for a fast read (e.g., fast mode read error rate), a normal read flag, a fast read flag, an LDPC action, and/or read parameters corresponding to the set of memory cells. In one embodiment, the error rate information may include information indicating whether to use a soft decoder mode or another LDPC mode. In some embodiments, the bit error rate for a normal read may be a number of errors that occurs when a normal read is used to read the set of memory cells and/or a number of errors that occurs when a normal read is used to read the set of memory cells divided by the number of memory cells in the set of memory cells. Moreover, in certain embodiments, the bit error rate for a fast read may be a number of errors that occurs when a fast read is used to read the set of memory cells and/or a number of errors that occurs when a fast read is used to read the set of memory cells divided by the number of memory cells in the set of memory cells.

As used herein, a normal read flag may also refer to a normal read safe flag, a normal read mode flag, a normal mode flag, and/or a normal read indication. In certain embodiments, a normal read flag may indicate whether it is usable, safe, and/or desirable to perform a normal read on the set of memory cells. In some embodiments, the normal read flag is set based on a number of errors that occurs in response to a normal read of the set of memory cells and/or a bit error rate for a normal read of the set of memory cells.

Furthermore, as used herein, a fast read flag may also refer to a fast read safe flag, a fast read mode flag, a fast mode flag, and/or a fast read indication. In certain embodiments, a fast read flag may indicate whether it is usable, safe, and/or desirable to perform a fast read on the set of memory cells. In some embodiments, the fast read flag is set based on a number of errors that occurs in response to a fast read of the set of memory cells and/or a bit error rate for a fast read of the set of memory cells.

Moreover, as used herein, an LDPC action may include a normal LDPC action (e.g., normal LDPC mode), a soft decoder LDPC action (e.g., soft decoder LDPC mode, soft decoder mode), a full power (FP) LDPC action (e.g., full power LDPC mode, full power mode), and/or a best effort (BE) LDPC action (e.g., best effort LDPC mode, best effort mode). In certain embodiments, a FP LDPC action may use all available computing power and/or available energy to decode data as fast as possible. In various embodiments, a BE LDPC action and/or a soft decoder LDPC action may refer to substantially the same thing in which soft bit information from soft reads is decoded. In some embodiments, the read parameters may refer to a read configuration, voltage threshold configuration, a set of predetermined read parameters, and/or a read parameter configuration. In some embodiments, the read parameters may include any suitable parameters used to perform a read on the set of memory cells.

In certain embodiments, a fast read (or fast read mode) may refer to a read that is performed faster than a normal read (or normal read mode). In some embodiments, the fast read may be 0% to 15%, 5% to 30%, or 0% to 35% faster than a normal read, for example. In various embodiments, a normal read may take approximately 60 microseconds, while a fast read may take approximately 50 microseconds. In certain embodiments, a fast read may start sensing data before a signal settles resulting in the faster read time. However, in some embodiments, a bit error rate (BER) may be higher in response to a fast read being performed as compared to a normal read. In various embodiments, in response to a bit error rate being higher than a certain level, LDPC throughput may be slower than if the bit error rate is lower than the certain level.

In various embodiments, the error rate storage circuit 504 may determine a fast read error rate corresponding to performing a fast read on the memory block using a set of predetermined read parameters. In some embodiments, the error rate storage circuit 504 may determine the fast read error rate by performing a fast read on the memory block and/or calculating the fast read error rate based on a number of bit errors that result from performing the fast read on the memory block. In one embodiment, the error rate storage circuit 504 may generate a fast read mode indicator based on a number of bit errors resulting from a fast read test on a plurality of memory cells. In certain embodiments, the error rate storage circuit 504 may determine a normal read error rate corresponding to performing a normal read on the memory block using a set of predetermined read parameters. In various embodiments, the error rate storage circuit 504 may determine the normal read error rate by performing a normal read on the memory block and/or calculating the normal read error rate based on a number of bit errors that result from performing the normal read on the memory block. In some embodiments, the error rate storage circuit 504 may generate a normal read mode indicator based on a number of bit errors resulting from a normal read test on the plurality of memory cells.

In certain embodiments, the error rate storage circuit 504 may store error rate information in a table, such as a dynamic read table (DRT) and/or a cell voltage distribution (CVD) table. In some embodiments, the error rate storage circuit 504 may store a normal read mode indicator, data indicating a normal read error rate, an indication that indicates whether to perform a normal read on a set of memory cells based on a set of predetermined read parameters, data indicating a fast read error rate, a fast read mode indicator, an indication that indicates whether to perform a fast read on the memory block based on a set of predetermined read parameters, and/or data indicating a set of predetermined read parameters. Table 1 shows one embodiment of a table used to store error rate information for multiple sets of memory cells (e.g., multiple memory blocks).

TABLE 1

| Block Number | Read Parameters | Normal Read BER | Fast Read BER | Normal Read Flag | Fast Read Flag | LDPC Action |
|---|---|---|---|---|---|---|
| 1 | Set 1 | 0.10% | 0.200% | Y | Y | Normal |
| 2 | Set 1 | 0.60% | 0.700% | N | N | FP/BE |
| 3 | Set 1 | 0.20% | 0.300% | Y | Y | Normal |

TABLE 1-continued

| Block Number | Read Parameters | Normal Read BER | Fast Read BER | Normal Read Flag | Fast Read Flag | LDPC Action |
|---|---|---|---|---|---|---|
| 4 | Set 1 | 0.30% | 0.400% | Y | Y | Normal |
| 5 | Set 1 | 0.40% | 0.500% | Y | N | Normal |
| 6 | Set 1 | 0.16% | 0.263% | Y | Y | Normal |
| 7 | Set 1 | 0.17% | 0.270% | Y | Y | Normal |
| 8 | Set 1 | 0.38% | 0.480% | Y | N | Normal |

In Table 1, the block number column indicates a block number (e.g., a set of memory cells), the read parameter column indicates specific read parameters (e.g., voltage threshold parameters) corresponding to the block number (e.g., Set 1 is used here, but different sets may be used for the same block numbers or for different block numbers, Set 1 here may be AR3, BR3, CR3, DR3, ER3, FR3, GR3), the normal read BER column indicates a bit error rate for a normal read, the fast read BER column indicates a bit error rate for a fast read, the normal read column indicates a "Y" if it is acceptable to perform a normal read for the block number and indicates a "N" if it is not acceptable to perform a normal read for the block number, the fast read column indicates a "Y" if it is acceptable to perform a fast read for the block number and indicates a "N" if it is not acceptable to perform a fast read for the block number, and the LDPC column indicates a type of LDPC action performed in conjunction with the acceptable type of read. Table 1 is one embodiment of types of error rate information that may be stored. As may be appreciated, other types of error rate information may be stored and/or the error rate information may be stored using any suitable manner. For example, Table 1 may include binary representations of the information shown.

In some embodiments, the mode selection circuit 506 may determine a read mode of a plurality of read modes for reading a set of memory cells based on error rate information. In certain embodiments, the plurality of read modes includes a fast read mode, a normal read mode, a soft decoder mode, a normal LDPC mode, a full power mode, and/or a best effort mode. In various embodiments, the mode selection circuit 506 may determine to perform a fast read in response to a fast read error rate satisfying a fast read error rate threshold. For example, the mode selection circuit 506 may determine to perform a fast read in response to a fast read error rate being greater than, greater than and equal to, less than, and/or less than and equal to a fast read error threshold. In certain embodiments, the mode selection circuit 506 may determine to perform a normal read in response to a fast read error rate failing to satisfy a fast read error rate threshold and a normal read error rate satisfying a normal read error rate threshold. For example, the mode selection circuit 506 may determine to perform a normal read in response to a fast read error rate failing to satisfy a fast read error rate threshold and a normal read error rate being greater than, greater than and equal to, less than, and/or less than and equal to a normal read error threshold. As used herein, failing to satisfy a threshold may be an opposite of satisfying a threshold. For example, if an error threshold is satisfied by an error rate being greater than the error threshold, the error rate fails to satisfy (e.g., does not satisfy) the error threshold by the error rate being less than or equal to the error threshold.

In various embodiments, the read circuit 508 may perform a read on the set of memory cells based on the read mode. For example, in one embodiment, the read circuit 508 may perform a read operation for a set of memory cells based on the mode selection circuit 506 selecting one or more of a stored fast read mode indicator and a normal read mode indicator.

Figure 6:
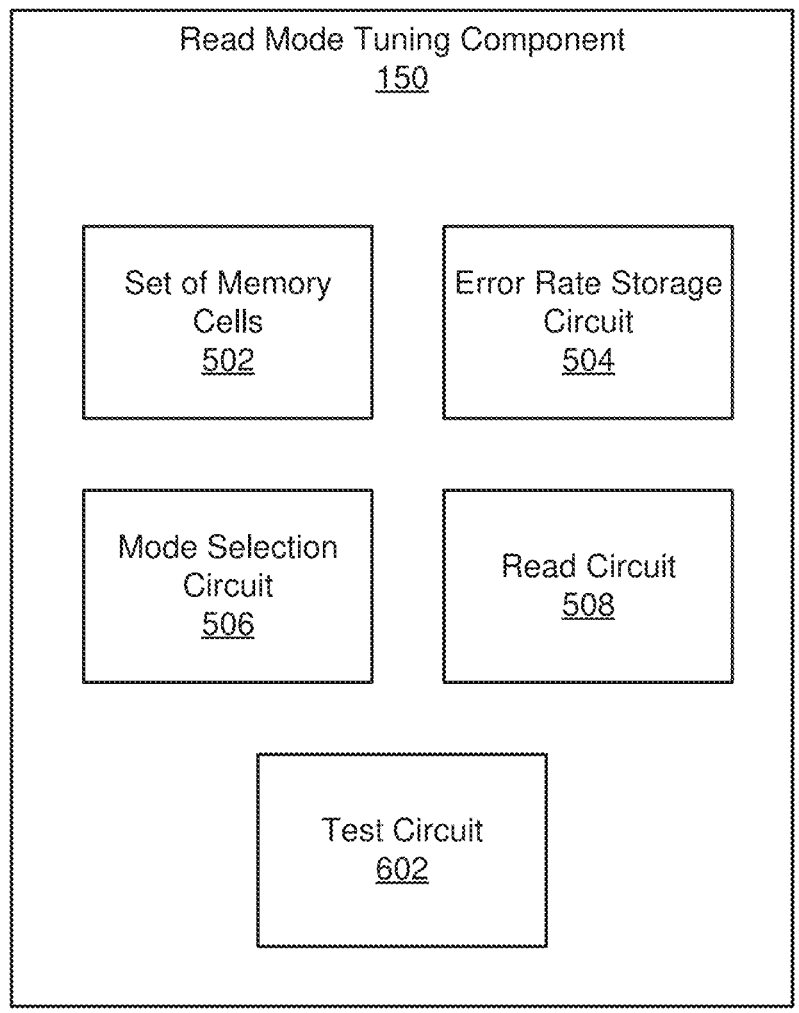
FIG. 6 is a schematic block diagram illustrating another embodiment of a read mode tuning component.

FIG. 6 depicts another embodiment of a read mode tuning component 150. The read mode tuning component 150 may be substantially similar to the read mode tuning component 150 described above with regard to FIGS. 1A, 1B, 2, 3, and/or 5. In general, as described above, the read mode tuning component 150 determines a fast read error rate corresponding to performing a fast read on the memory block using a set of predetermined read parameters, and performs a fast read in response to the fast read error rate satisfying a fast read error rate threshold. In some embodiments, the fast read performs a read at a faster speed than a normal read. Accordingly, the read mode tuning component 150 may facilitate performing read mode tuning. In the depicted embodiment, the read mode tuning component 150 includes a set of memory cells 502, an error rate storage circuit 504, a mode selection circuit 506, and a read circuit 508. The set of memory cells 502, the error rate storage circuit 504, the mode selection circuit 506, and the read circuit 508 may be substantially similar to the set of memory cells 502, the error rate storage circuit 504, the mode selection circuit 506, and the read circuit 508 described in relation to FIG. 5. Moreover, the read mode tuning component 150 includes a test circuit 602.

In one embodiment, the test circuit 602 is a circuit that determines the error rate information by performing one or more tests on a set of memory cells. In certain embodiments, the one or more tests may include a fast read on the set of memory cells and a normal read on the set of memory cells. Based on the result of the one or more tests on the set of memory cells, error rate information may be determined and/or stored.

Figure 7:
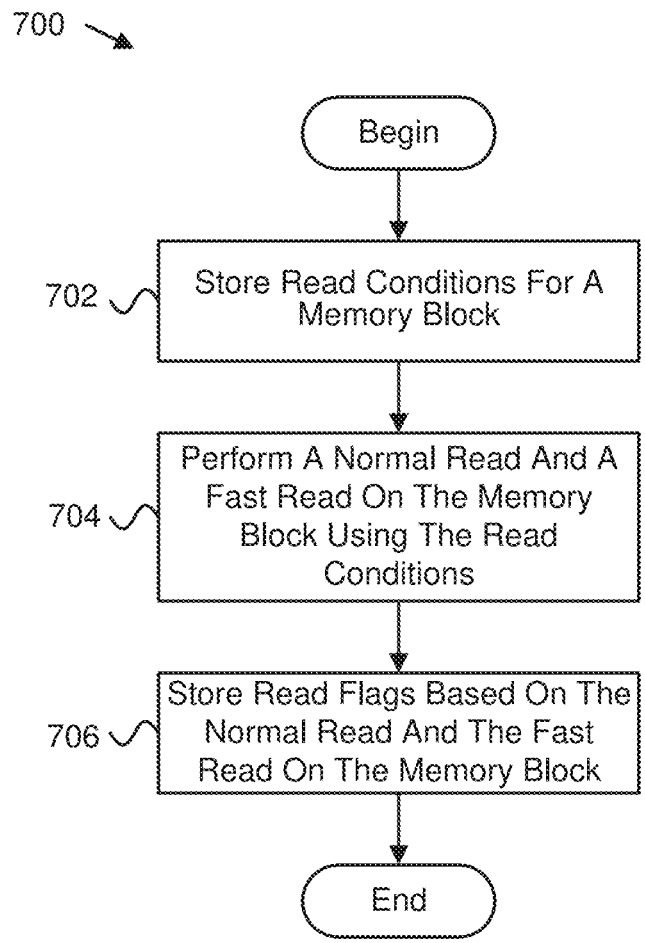
FIG. 7 is a schematic flow chart diagram illustrating one embodiment of a method for storing read flags.

FIG. 7 is a schematic flow chart diagram illustrating one embodiment of a method 700 for storing read flags. The method 700 begins, and the read mode tuning component 150 stores 702 read conditions (e.g., error rate information) for a memory block (e.g., set of memory cells). In one embodiment, the read circuit 508 performs 704 a normal read and a fast read on the memory block using the read conditions. In certain embodiments, the error rate storage circuit 504 stores 706 read flags based on the normal read and the fast read on the memory block (e.g., stores error rate information), and the method 700 ends.

Figure 8:
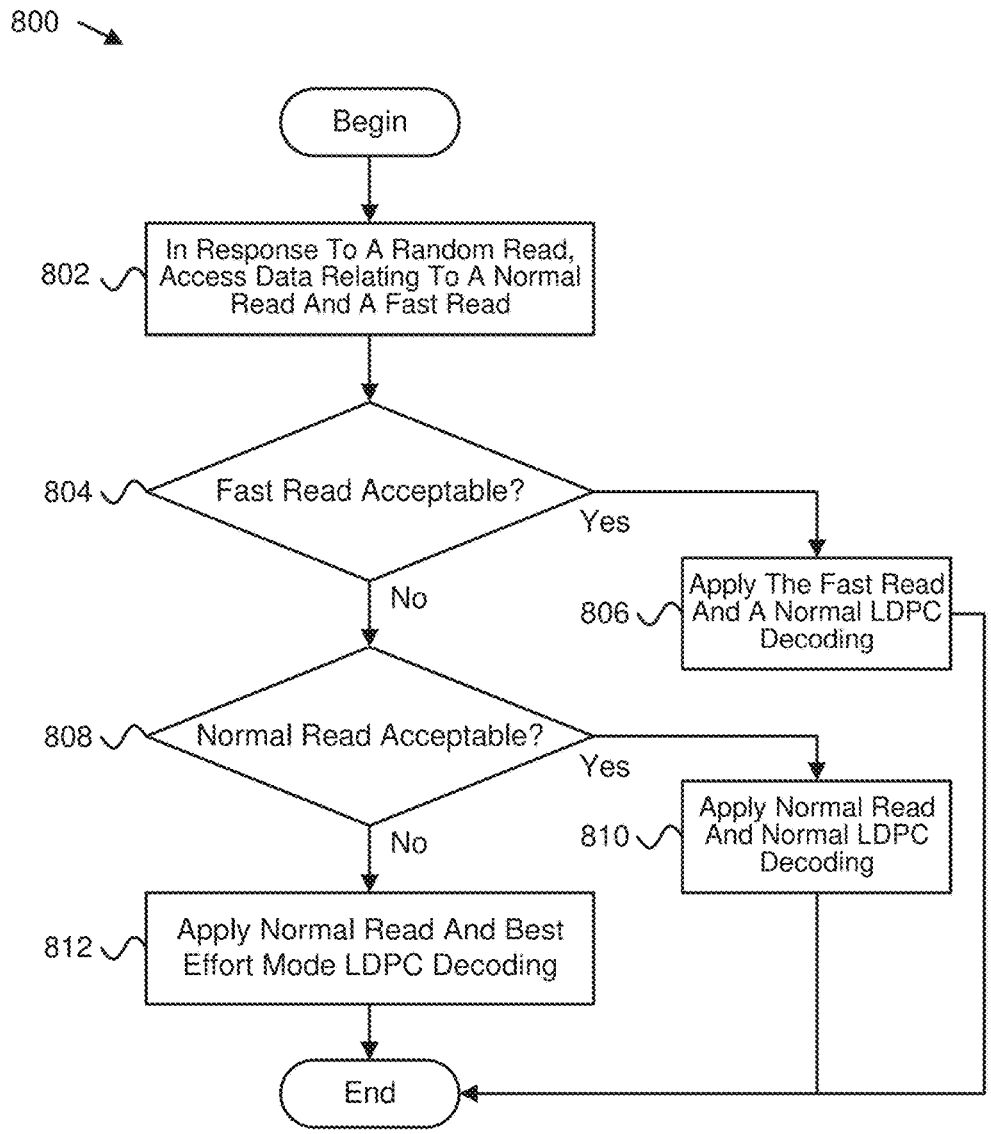
FIG. 8 is a schematic flow chart diagram illustrating one embodiment of a method for performing read mode tuning.

FIG. 8 is a schematic flow chart diagram illustrating one embodiment of a method 800 for performing read mode tuning. The method 800 begins, and the read mode tuning component 150, in response to a random read, accesses 802 data relating to a normal read and a fast read. In one embodiment, the mode selection circuit 506 determines 804 whether a fast read is acceptable. In certain embodiments, the read circuit 508, in response to a fast read being acceptable, applies 806 the fast read and a normal LDPC decoding, and the method 800 ends. In certain embodiments, in response to a fast read not being acceptable, the mode selection circuit 506 determines 808 whether a normal read is acceptable. In certain embodiments, the read circuit 508, in response to a normal read being acceptable, applies 810 the normal read and the normal LDPC decoding, and the method 800 ends. In certain embodiments, in response to a normal read not being acceptable, the read circuit 508 applies 812 a normal read and a best effort mode LDPC decoding, and the method 800 ends.

Figure 9:
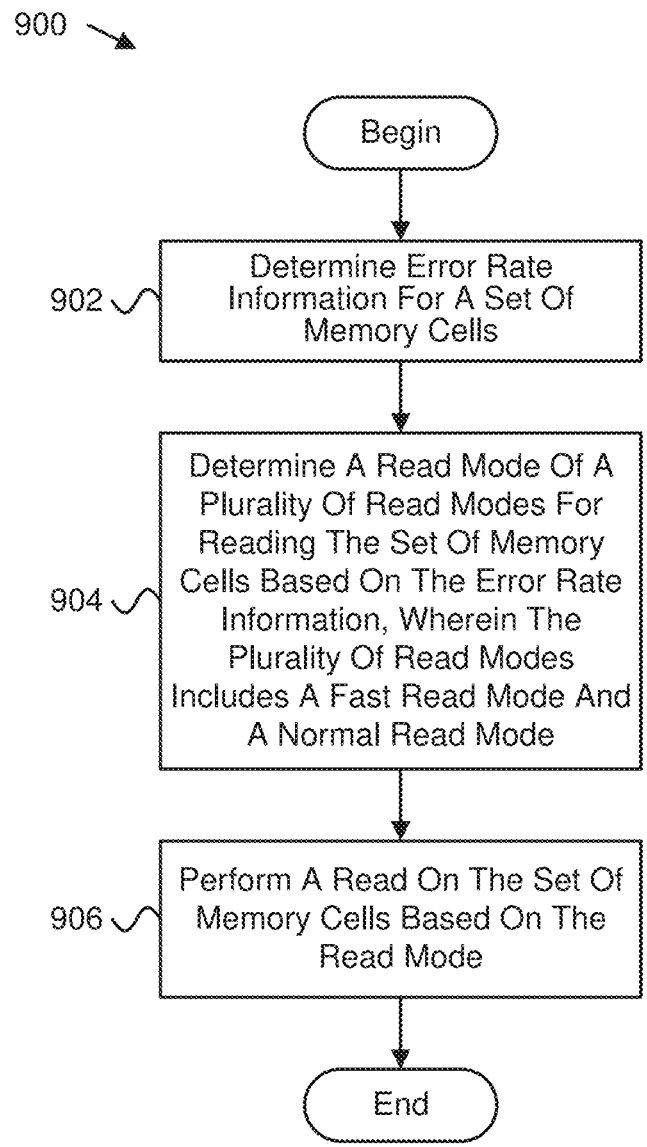
FIG. 9 is a schematic flow chart diagram illustrating another embodiment of a method for performing read mode tuning.

FIG. 9 is a schematic flow chart diagram illustrating another embodiment of a method 900 for performing read mode tuning. The method 900 begins, and the error rate storage circuit 504 determines 902 error rate information for a set of memory cells. In various embodiments, the mode selection circuit 506 determines 904 a read mode of a plurality of read modes for reading the set of memory cells based on the error rate information. In such embodiments, the plurality of read modes includes a fast read mode and a normal read mode. In one embodiment, the read circuit 508 performs 906 a read on the set of memory cells based on the read mode, and the method 900 ends.

A means for generating a fast read mode indicator based on a number of errors resulting from a fast read test on a plurality of memory cells, in various embodiments, may include one or more of a read mode tuning component 150, an error rate storage circuit 504, a die controller 220, a state machine 222, a sense amplifier 250, read/write circuits 230, a non-volatile memory device 120, a non-volatile memory medium controller 126, a non-volatile memory device interface 139, a host computing device 110, a device driver, a controller (e.g., a device driver, or the like) executing on a host computing device 110, a processor 111, an FPGA, an ASIC, other logic hardware, and/or other executable code stored on a computer readable storage medium. Other embodiments may include similar or equivalent means for generating a fast read mode indicator based on a number of errors resulting from a fast read test on a plurality of memory cells.

A means for storing a fast read mode indicator, in certain embodiments, may include one or more of a read mode tuning component 150, an error rate storage circuit 504, a die controller 220, a state machine 222, a sense amplifier 250, read/write circuits 230, a non-volatile memory device 120, a non-volatile memory medium controller 126, a non-volatile memory device interface 139, a host computing device 110, a device driver, a controller (e.g., a device driver, or the like) executing on a host computing device 110, a processor 111, an FPGA, an ASIC, other logic hardware, and/or other executable code stored on a computer readable storage medium. Other embodiments may include similar or equivalent means for storing a fast read mode indicator.

A means for generating a normal read mode indicator based on a number of errors resulting from a normal read test on a plurality of memory cells, in various embodiments, may include one or more of a read mode tuning component 150, an error rate storage circuit 504, a die controller 220, a state machine 222, a sense amplifier 250, read/write circuits 230, a non-volatile memory device 120, a non-volatile memory medium controller 126, a non-volatile memory device interface 139, a host computing device 110, a device driver, a controller (e.g., a device driver, or the like) executing on a host computing device 110, a processor 111, an FPGA, an ASIC, other logic hardware, and/or other executable code stored on a computer readable storage medium. Other embodiments may include similar or equivalent means for generating a normal read mode indicator based on a number of errors resulting from a normal read test on a plurality of memory cells.

A means for storing a normal read mode indicator, in certain embodiments, may include one or more of a read mode tuning component 150, an error rate storage circuit 504, a die controller 220, a state machine 222, a sense amplifier 250, read/write circuits 230, a non-volatile memory device 120, a non-volatile memory medium controller 126, a non-volatile memory device interface 139, a host computing device 110, a device driver, a controller (e.g., a device driver, or the like) executing on a host computing device 110, a processor 111, an FPGA, an ASIC, other logic hardware, and/or other executable code stored on a computer readable storage medium. Other embodiments may include similar or equivalent means for storing a normal read mode indicator.

A means for performing a read operation for a plurality of memory cells based on one or more of a stored fast read mode indicator and a normal read mode indicator, in certain embodiments, may include one or more of a read mode tuning component 150, a read circuit 508, a die controller 220, a state machine 222, a sense amplifier 250, read/write circuits 230, a non-volatile memory device 120, a non-volatile memory medium controller 126, a non-volatile memory device interface 139, a host computing device 110, a device driver, a controller (e.g., a device driver, or the like) executing on a host computing device 110, a processor 111, an FPGA, an ASIC, other logic hardware, and/or other executable code stored on a computer readable storage medium. Other embodiments may include similar or equivalent means for performing a read operation for a plurality of memory cells based on one or more of a stored fast read mode indicator and a normal read mode indicator.

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

What is claimed is:

1. An apparatus comprising:
a set of memory cells;
an error rate storage circuit that determines error rate information for the set of memory cells and stores the error rate information corresponding to the set of memory cells as stored error rate information;
a mode selection circuit that determines a read mode of a plurality of read modes for reading the set of memory cells based on the stored error rate information, wherein the plurality of read modes comprises a fast read mode and a normal read mode; and
a read circuit that performs a read on the set of memory cells based on the read mode.

2. The apparatus of claim 1, wherein the error rate information is stored in a table corresponding to the set of memory cells.

3. The apparatus of claim 1, wherein the error rate information comprises read parameters corresponding to the set of memory cells.

4. The apparatus of claim 1, wherein the error rate information comprises one or more of a fast mode read error rate and a normal mode read error rate.

5. The apparatus of claim 1, wherein the error rate information comprises one or more of a fast mode flag that indicates whether the fast read mode is usable, and a normal mode flag that indicates whether the normal read mode is usable.

6. The apparatus of claim 1, wherein the read mode comprises one or more of a soft decoder mode, a full power decoder mode, and a best effort decoder mode.

7. The apparatus of claim 6, wherein the error rate information comprises information indicating which of the soft decoder mode, the full power decoder mode, and the best effort decoder mode to use to perform the read.

8. The apparatus of claim 1, further comprising a test circuit that determines the error rate information by performing one or more tests on the set of memory cells.

9. The apparatus of claim 8, wherein the one or more tests comprises a fast read on the set of memory cells and a normal read on the set of memory cells.

10. A system comprising:
a memory block;
a controller for the memory block, the controller configured to:
determine a fast read error rate corresponding to performing a fast read on the memory block using a set of predetermined read parameters; and
perform a fast read in response to the fast read error rate satisfying a fast read error rate threshold, wherein the fast read performs a read at a faster speed than a normal read.

11. The system of claim 10, wherein the controller is configured to determine a normal read error rate corresponding to performing a normal read on the memory block using the set of predetermined read parameters.

12. The system of claim 11, wherein controller is configured to perform a normal read in response to the fast read error rate failing to satisfy the fast read error rate threshold and the normal read error rate satisfying a normal read error rate threshold.

13. The system of claim 11, wherein the controller is configured to determine the normal read error rate by performing a normal read on the memory block.

14. The system of claim 11, wherein the controller is configured to store data indicating the normal read error rate.

15. The system of claim 11, wherein the controller is configured to store an indication that indicates whether to perform a normal read on the memory block based on the set of predetermined read parameters.

16. The system of claim 10, wherein the controller is configured to determine the fast read error rate by performing a fast read on the memory block.

17. The system of claim 10, wherein the controller is configured to store data indicating the fast read error rate.

18. The system of claim 10, wherein the controller is configured to store an indication that indicates whether to perform a fast read on the memory block based on the set of predetermined read parameters.

19. The system of claim 10, wherein the controller is configured to store data indicating the set of predetermined read parameters.

20. An apparatus comprising:
means for generating a fast read mode indicator based on a number of errors resulting from a fast read test on a plurality of memory cells;
means for storing the fast read mode indicator;
means for generating a normal read mode indicator based on a number of errors resulting from a normal read test on the plurality of memory cells;
means for storing the normal read mode indicator; and
means for performing a read operation for the plurality of memory cells based on one or more of the stored fast read mode indicator and the normal read mode indicator.

* * * * *